United States Patent
Deng (10) Patent No.: US 6,539,526 B1
(45) Date of Patent: Mar. 25, 2003

(54) METHOD AND APPARATUS FOR DETERMINING CAPACITANCES FOR A DEVICE WITHIN AN INTEGRATED CIRCUIT

(75) Inventor: Xiaowei Deng, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 169 days.

(21) Appl. No.: 09/697,944

(22) Filed: Oct. 26, 2000

Related U.S. Application Data (60) Provisional application No. 60/171,769, filed on Dec. 22, 1999.

(51) Int. Cl.⁷ .......................... G06F 17/50; H01L 29/76
(52) U.S. Cl. .................... 716/5; 716/4; 716/5; 257/288
(58) Field of Search .......................................... 716/4, 5

(56) References Cited

U.S. PATENT DOCUMENTS

| | | | | |
|---|---|---|---|---|
| 3,833,429 A | * | 9/1974 | Monma et al. | 148/DIG. 106 |
| 4,745,084 A | * | 5/1988 | Rowson et al. | 257/206 |
| 5,831,870 A | * | 11/1998 | Folta et al. | 716/5 |
| 5,838,582 A | * | 11/1998 | Mehrotra et al. | 716/5 |
| 5,987,086 A | * | 11/1999 | Raman et al. | 716/1 |
| 6,169,302 B1 | * | 1/2001 | Long et al. | 257/288 |
| 6,215,160 B1 | * | 4/2001 | Suda | 257/370 |
| 6,314,545 B1 | * | 11/2001 | Kapur et al. | 703/1 |
| 6,314,546 B1 | * | 11/2001 | Muddu | 716/5 |
| 6,374,391 B1 | * | 4/2002 | Yamada | 716/5 |
| 6,381,730 B1 | * | 4/2002 | Chang et al. | 716/4 |

* cited by examiner

Primary Examiner—Matthew Smith
Assistant Examiner—Andrea Liu
(74) Attorney, Agent, or Firm—Jacqueline J. Garner; Wade James Brady, III; Frederick J. Telecky, Jr.

(57) ABSTRACT

An integrated circuit (10) includes a device such as a transistor. A layout (90) of the device is prepared, which in the case of the transistor includes a ground plane section (52), spaced diffusion sections (56A–56B) and a gate section (57). In order to accurately identify all capacitances associated with the transistor, the gate section is subdivided into three subsections (57A–57C) which are treated as electrically separate, and the two diffusion sections are treated as electrically separate from structure external to the transistor that is electrically coupled to them. Capacitances are then identified between each pair of the electrically separate portions. Some of the identified capacitances may optionally be discarded. Capacitances identified for various portions that are actually in electrical contact are then summed in a specified manner, after which the summed capacitances are used to facilitate simulation of the operation of the integrated circuit.

24 Claims, 4 Drawing Sheets

METHOD AND APPARATUS FOR DETERMINING CAPACITANCES FOR A DEVICE WITHIN AN INTEGRATED CIRCUIT

This application claims priority under 35 USC §119(e)(1) of provisional application No. 60/171,769 filed Dec. 22, 1999.

TECHNICAL FIELD OF THE INVENTION

This invention relates in general to techniques for simulating integrated circuits and, more particularly, to such techniques which include determining various capacitances associated with circuit devices within an integrated circuit.

BACKGROUND OF THE INVENTION

An integrated circuit typically includes a number of circuit devices such as transistors, as well as interconnections between those circuit devices. The interconnections between circuit devices typically include parasitic capacitances, which can affect the operation of the integrated circuit. For example, in a conductive path which connects one transistor to another transistor, a parasitic capacitance associated with the path may have the effect of creating propagation delays that delay signals traveling along the path.

In older semiconductor technologies, where a given integrated circuit would have a larger size than it does in current semiconductor technologies, conductive paths that connected respective circuit devices were somewhat longer than in current technologies, and had greater spacing between them. In current technologies, conductive paths that connect devices are narrower in width and are closer to each other than was the case in prior technologies. As a result, and due to the decreasing size of the devices themselves, the parasitic capacitances associated with interconnections between circuit devices have come to represent a greater percent of the cause of overall propagation delays than was the case for past technologies. This is particularly true for static random access memory cells (SRAM cells), which have a complex physical structure, and for which speed is a critical operational characteristic of interest.

A further consideration is that, as integrated circuits become progressively more complex due to increasing levels of integration, the time and effort involved in designing new integrated circuits cannot be permitted to progressively increase at a rate proportional to the increasing complexity of the integrated circuits. Integrated circuit design tends to be somewhat iterative, in that a design is prepared, then evaluated, then modified, then evaluated again, then modified again, and so forth. Consequently, new design techniques are needed which facilitate rapid and accurate evaluation of how a particular design will perform. Accuracy is as significant as speed, because accuracy can reduce the number of iterations in the design cycle.

In the early days of integrated circuits, in order to evaluate whether a given integrated circuit would operate in a satisfactory manner, it was often feasible to build and test an actual prototype of the integrated circuit. Since then, however, as integrated circuits have become progressively more complex, progressively greater emphasis has been placed on techniques for effecting theoretical simulations of the operation of an integrated circuit and the devices in it, for example through the use of computer programs.

With respect to specific circuit devices, such as transistors, computer models have been developed that provide a relatively accurate representation of the device itself, including capacitances which are internal to the device. These internal capacitances are commonly referred to as device capacitances. On the other hand, with respect to capacitances external to the device, including capacitances between structure internal to the device and structure external to the device, existing computer program tools do not accurately take into account these additional capacitances, which are common referred to as interconnect capacitances. As discussed above, the effect of interconnect capacitances is becoming a progressively more significant factor in the cause of propagation delays, as the level of integration progressively increases. Accordingly, there is a progressively increasing need for simulation and modeling techniques that will take into account all relevant capacitances associated with devices in an integrated circuit, including both device capacitances and interconnect capacitances.

As mentioned above, there are existing computer programs which take device capacitances into account, but not interconnect capacitances. In order to also take interconnect capacitances into account, special provisions are needed, and the following is one current approach used in the art. A layout for all or part of an integrated circuit is supplied to a computer program which is a circuit description file generator program, and which produces a circuit description file that is a representation of the integrated circuit, or a selected part of it. The circuit description file can be supplied to an existing simulator program, in response to which the simulator program can simulate the operation of the integrated circuit.

The circuit description file includes a definition of each circuit device such as a transistor, and an accurate definition of device capacitances that are internal to each such device. However, existing circuit description file generator programs do not take into account certain other types of capacitances, such as the interconnect capacitances which are becoming progressively more critical factors in the design and evaluation of integrated circuits. In order to compensate for this, the layout for all or part of the integrated circuit is supplied not only to the circuit description file generator program, but also to a special extractor computer program, which is capable of identifying capacitances other than the device capacitances. The extractor program also receives a technology definition. The output of the extractor program is a capacitance definition, which is also sometimes referred to as a capacitance matrix.

Since the above-mentioned circuit description file generated for the simulator program already includes an accurate representation of the device capacitances within each device, there would be duplication if these device capacitances were left in the capacitance definition. Therefore, an attempt is made to remove them, so as to leave other capacitances that are not taken into account by the input file, such as interconnect capacitances. However, the device capacitances are not always clearly separate from the interconnect capacitances in the capacitance definition, as a result of which some approximations have to be made in an attempt to remove the effects of the device capacitances, and these approximations introduce errors that limit the accuracy of the final result.

The circuit description file and the interconnect capacitances, to the extent that the interconnect capacitances can be separated from the device capacitances, are both subsequently supplied to the simulator program, usually after being merged into a single file that is typically referred to as a circuit description with parasitic capacitances. The simulator program then uses this information to simulate the operation of the integrated circuit, in a manner which is more accurate than would be the case if the simulator program received only the circuit description file, without any definition of the interconnect capacitances. While this known approach has been generally adequate for its intended purposes, it has not been satisfactory in all respects.

More specifically, with respect to the extractor computer programs discussed above, one common class of existing programs take a somewhat two-dimensional approach to the analysis of information derived from the layout and the technology definition. Programs in this class tend to find most interconnect capacitances, but the values which they determine for these capacitances frequently include a substantial degree of error. This is sometimes due in part to the need to make approximations of the type discussed above, in an attempt to separate the effects of interconnect capacitances from the effects of device capacitances. Consequently, it is common for programs in this class to identify capacitance values which have an average degree of error of about 50%. In other words, the values determined by these programs for interconnect capacitances may, on average, be 50% higher or lower than the actual values. As discussed above, interconnect capacitances are becoming progressively more significant as a factor in the analysis of integrated circuits. Consequently, the 50% error level is becoming progressively less acceptable to circuit designers.

A more sophisticated class of extractor programs takes a somewhat three-dimensional approach to the analysis of the information derived from the layout and the technology definition. Extractor programs in this class provide a greater level of accuracy than the other class of extractor programs discussed above, but still suffer from problems of the type discussed above, such as the need to make approximations in an attempt to separate the effects of interconnect capacitances from the effects of device capacitances. Consequently, these extractor programs determine values for interconnect capacitances which have an average degree of error of about 16%. This is effectively the highest level of accuracy available in the existing art. Nevertheless, as the level of integration progressively increases and interconnect capacitances become a progressively more significant factor in the simulation and analysis of integrated circuit designs, integrated circuit designers are looking for an even greater level of accuracy in the identification of values for interconnect capacitances.

SUMMARY OF THE INVENTION

From the foregoing, it may be appreciated that a need has arisen for a method and apparatus for facilitating simulation of an integrated circuit in a manner which ensures that all significant capacitances within the integrated circuit are accurately identified and taken into account for purposes of the simulation.

According to the present invention, a method and apparatus are provided to address this need, and involve simulating an integrated circuit which includes a plurality of conductive nets that are electrically separate from each other, which includes a device having a plurality of conductive first sections that are each part of a respective net, and which includes a conductive second section external to the device, the second section being part of one of the nets which includes one of the first sections. A set of capacitances associated with the device is determined by: subdividing at least one of the nets on a theoretical basis so as to identify a plurality of net portions that collectively define the nets, in a manner so that the first and second sections are allocated to different net portions; treating the net portions as theoretically electrically separate from each other, while identifying respective capacitances between each net portion and each of the other net portions; and determining each capacitance of the set by summing the capacitances which have been identified between each of the net portions of one of the nets and a net portion of a further net. As to the net portions, it is possible for a given net portion to correspond to an entire net, or to only a portion of a net.

BRIEF DESCRIPTION OF THE DRAWINGS

A better understanding of the present invention will be realized from the detailed description which follows, taken in conjunction with the accompanying drawings, in which.

DETAILED DESCRIPTION OF THE INVENTION

Figures 1, 2:
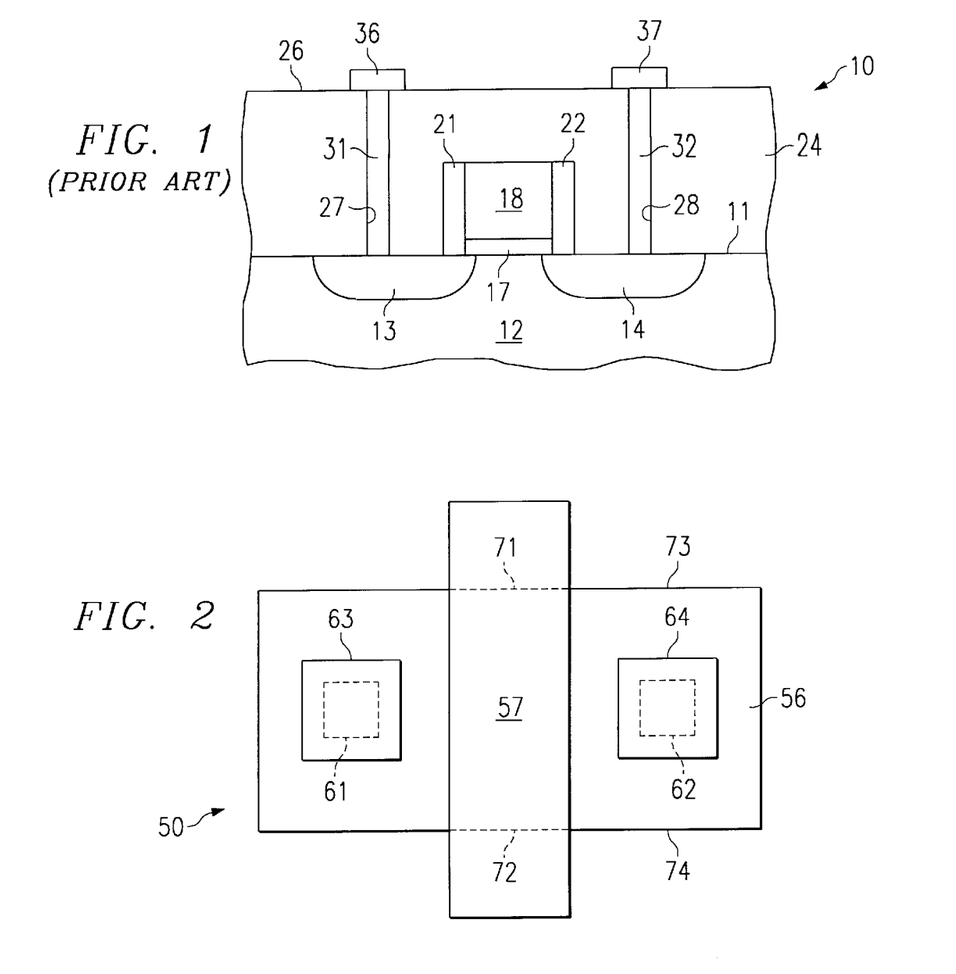
FIG. 1 is a diagrammatic fragmentary sectional side view of part of an integrated circuit, the design and development of which can be carried out using principles that embody the present invention.
FIG. 2 is a diagrammatic top view of an original layout representing a transistor which is embodied in the integrated circuit of FIG. 1.

FIG. 1 is a diagrammatic fragmentary sectional side view of a portion of an integrated circuit 10, the design and development of which can be carried out using principles that embody the present invention. The integrated circuit 10 implements a field effect transistor (FET).

In more detail, the integrated circuit 10 includes a silicon semiconductor substrate 12 having adjacent its top surface 11 two spaced regions 13 and 14 that have been doped in a known manner so as to respectively define the source and drain of the transistor. A gate oxide layer 17 of silicon dioxide is provided on the top surface 11 of the substrate 12, the layer 17 being disposed between the source and drain regions 13 and 14, and being arranged so that its end portions slightly overlap the source and drain regions. A gate electrode 18 made of a polysilicon material is provided on the gate oxide layer 17. Sidewalls 21 and 22 are provided on opposite sides of the gate electrode 18 and gate oxide layer 17, and in the disclosed embodiment are made of a nitride material. The gate electrode 18, gate oxide layer 17, and sidewalls 21–22 together define a gate structure.

A layer 24 of a dielectric material such as silicon dioxide has been deposited over the top of the substrate 12 and the gate structure, and has a top surface 26 at a level higher than the upper end of the gate structure. Two via openings 27 and 28 have been etched downwardly through the dielectric layer 24 from its top surface 26 to the top surface 11 of the substrate 12. The via openings 27 and 28 are respectively disposed over the source and drain regions 13 and 14. The via openings 27 and 28 each have therein a respective plug 31 or 32 made of a conductive material such as tungsten, each plug being in electrical conduct with a respective one of the source and drain 13 and 14.

Conductive metal interconnects 36 and 37 have been formed on the top surface 26 of the dielectric layer 24, and are each in electrical engagement with a respective one of the contacts 31 and 32. The interconnects 36 and 37 are part of a layer which is commonly referred to in the art as a metalization layer. In the disclosed embodiment, the interconnects 36 and 37 are formed by a known procedure which includes the steps of depositing a layer of a conductive material such as aluminum on the top surface 26 of the dielectric layer 24, thereafter applying a photoresist pattern to the top surface of the aluminum layer, and then etching away unwanted portions of the aluminum layer so as to leave only desired portions thereof, such as the interconnects 36 and 37.

The integrated circuit 10 includes further structure which is disposed on top of the structure illustrated in FIG. 1, but the further structure is of a known type which is not needed for an understanding of the present invention, and has therefore been omitted from FIG. 1 for purposes of clarity and convenience. The integrated circuit of FIG. 1 may include an electrical connection to the gate electrode 18, at a location which is spaced from the plane of FIG. 1 in a direction perpendicular to that plane, and which is thus not visible in FIG. 1.

Figure 3:
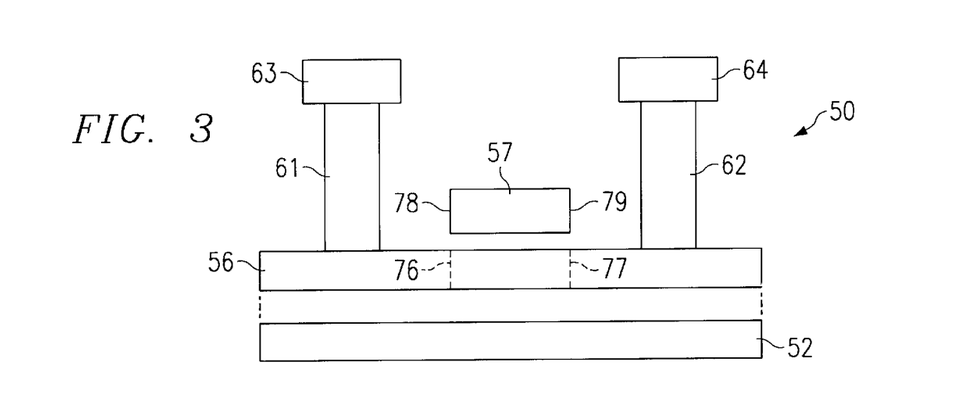
FIG. 3 is a diagrammatic sectional side view of the original layout of FIG. 2.

In association with the actual design of the integrated circuit 10 of FIG. 1, a layout of the integrated circuit 10 will be prepared, and will include a portion which represents the transistor shown in FIG. 1. FIGS. 2 and 3 are diagrammatic views of an original layout 50 which corresponds to the transistor of FIG. 1. More specifically, FIG. 2 is a diagrammatic top view of the layout 50, and FIG. 3 is a diagrammatic side view of the layout 50. In preparing the layout 50, each of the component portions of the transistor have been treated as being made of either a pure conductive material or a pure dielectric material. For purposes of clarity, only the conductive portions are shown in FIGS. 2 and 3. Partially conductive portions of the integrated circuit, such as the semiconductive substrate 12 and its diffusion regions 13 and 14, are treated as being purely conductive.

Looking now in more detail at the layout 50 of FIGS. 2 and 3, the layout includes a conductive section 52 which represents the ground plane effect provided by the substrate 12 of FIG. 1. The diffusion areas 13 and 14 are represented in FIGS. 2 and 3 by a single conductive diffusion section 56, which is parallel to and spaced slightly above the ground plane section 52. The gate electrode 18 of FIG. 1 is represented in the layout 50 by a conductive gate section 57. The gate section 57 may alternatively be referred to as a poly section. The gate section 57 is spaced a small distance above the diffusion section 56 in FIG. 3, in order to reflect the fact that, in FIG. 1, there is a nonconductive gate oxide layer 17 disposed between the gate electrode 18 and the substrate 12.

The tungsten plugs 31 and 32 of FIG. 1 are each represented in the layout 50 by a respective conductive contact section 61 or 62. The conductive interconnects 36 and 37 of FIG. 1 are each represented in the layout 50 by a respective conductive metalization section 63 or 64.

In order to facilitate accurate modeling of interconnect capacitances which are associated with the transistor represented by the layout 50 of FIGS. 2 and 3, a modified version of the layout is prepared. The first step in preparing the modified version of the layout is to create two theoretical slices 71 and 72 (FIG. 2) in the gate section 57, the slices 71 and 72 being respectively coplanar with the side edges 73 and 74 of the diffusion section 56. Similarly, two theoretical slices 76 and 77 (FIG. 3) are made in the diffusion section 56, the slices 76 and 77 being respectively coplanar with side edges 78 and 79 of the gate section 57. The next step in the preparation of the modified layout is to effect the theoretical removal from the layout of the central portion of the diffusion section 56 which is disposed between the two slices 76 and 77.

Figure 4:
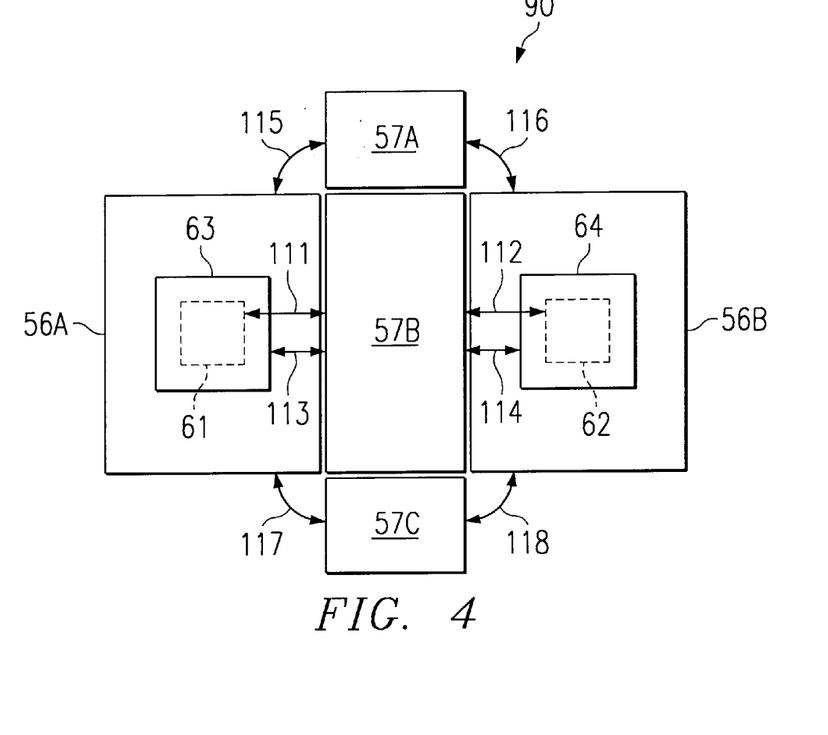
FIG. 4 is a diagrammatic top view of a modified layout which is derived from the original layout of FIGS. 2 and 3.
Figure 5:
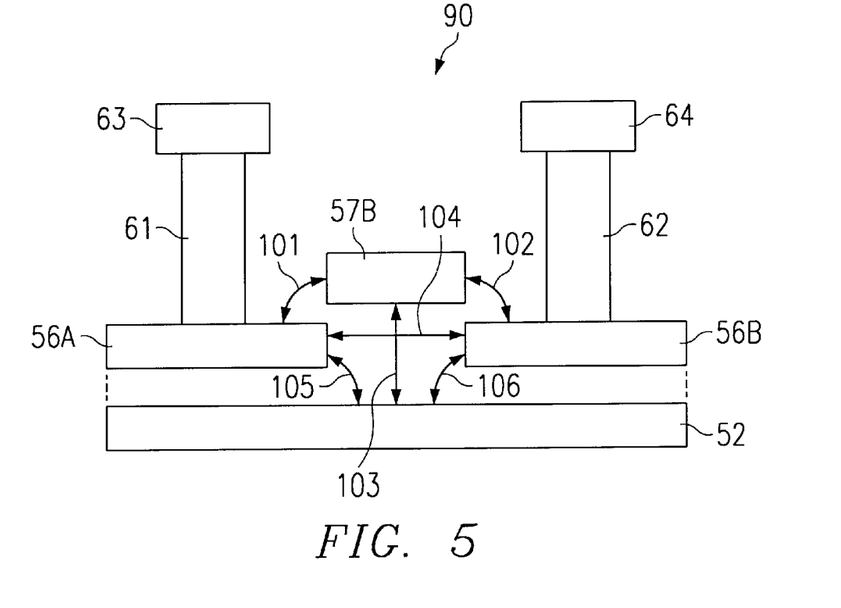
FIG. 5 is a diagrammatic sectional side view of the modified layout of FIG. 4.

The resulting modified layout is shown at 90 in FIGS. 4 and 5. The three subsections of the gate section which have been defined by the slices 71 and 72 are respectively identified in FIGS. 4 and 5 with reference numerals 57A, 57B and 57C. The outer subsections 57A, and 57C are referred to as field subsections, and the center subsection 57B is referred to as a gate subsection. As mentioned above, the center subsection of the diffusion section, which was located between the slices 76 and 77, is being ignored in FIGS. 4–5. The remaining two subsections of the diffusion section 56 are respectively identified with reference characters 56A and 56B. It will be noted that the diffusion subsections 56A and 56B each correspond to a respective one of the source and drain 13 and 14 shown in FIG. 1. For convenience, the slices made at 71–72 and 76–77 (FIGS. 2–3) are depicted diagrammatically in FIG. 4 as narrow gaps between the resulting subsections of the sliced sections. However, these gaps are provided only for purposes of clarity, and it should be kept in mind that each of the slices is actually treated as being infinitesimally thin, such that the subsections 57A and 57C are each viewed as being in direct physical contact with a respective side of the subsection 57B.

For the next portion of the present discussion, it is assumed that the gate subsection 57B is not in electrical contact with either of the gate subsections 57A and 57C. Further, it is assumed that the contact section 61 is not in electrical contact with either the diffusion subsection 56A or the metalization section 63. Similarly, it is assumed that the contact section 62 is not in electrical contact with either the diffusion subsection 56B or the metalization section 64. It should also be recognized that the contact sections 61–62 and the metalization sections 63–64 effectively correspond to structure which is external to the transistor itself. The gate subsections 57A and 57C are also treated as being external to the actual transistor for purposes of this portion of the present discussion. The remaining sections and subsections shown in FIGS. 4 and 5 are treated as being portions of the internal structure of the transistor device.

Turning now to FIG. 5, several capacitances which are internal to the transistor device are represented diagrammatically in FIG. 5 by double-headed arrows 101–106. These internal capacitances are referred to as device capacitances. In more detail, the device capacitance 101 is the capacitance between the gate subsection 57B and the diffusion subsection 56A, and the device capacitance 102 is between the gate subsection 57B and the diffusion subsection 56B. The device capacitance 103 is between the gate subsection 57B and the ground plane section 52, and the device capacitance 104 is between the diffusion subsection 56A and the diffusion subsection 56B. The device capacitance 105 is between the diffusion subsection 56A and the ground plane section 52, and the device capacitance 106 is between the diffusion subsection 56B and the ground plane section 52.

There are also capacitances between structure internal to the transistor device and structure external thereto, where the external structure includes interconnections to other devices. These capacitances between the transistor device and structure external to it are referred to herein as interconnect capacitances for the transistor, and are depicted diagrammatically in FIG. 4 by double-headed arrows 111–118.

In more detail, the interconnect capacitance 111 is the capacitance between the gate subsection 57B and the contact section 61, and the interconnect capacitance 112 is between the gate subsection 57B and the contact section 62. The interconnect capacitance 113 is between the gate subsection 57B and the metalization section 63, and the interconnect capacitance 114 is between the gate subsection 57B and the metalization section 64. Bearing in mind that the gate subsections 57A and 57C are electrically separate from the gate subsection 57B, and are being treated as structure external to the transistor device, the interconnect capacitance 115 is the capacitance between the gate subsection 57A and the diffusion subsection 56A, and the interconnect capacitance 116 is between the gate subsection 57A and the diffusion subsection 56B. The interconnect capacitance 117 is between the gate subsection 57C and the diffusion subsection 57A, and the interconnect capacitance 118 is between the gate subsection 57C and the diffusion subsection 56B.

According to the present invention, a relatively complete and accurate representation of the capacitances associated with the transistor device of interest will be obtained if all of the capacitances shown in FIGS. 4 and 5 are taken into account, including the device capacitances 101–106 shown in FIG. 5, as well as the interconnect capacitances 111–118 shown in FIG. 4. A feature of the present invention is the provision of a procedure for accurately taking all of these capacitances into account, and this procedure will now be described with reference to FIG. 6, which is a flowchart depicting this procedure.

Figure 6:
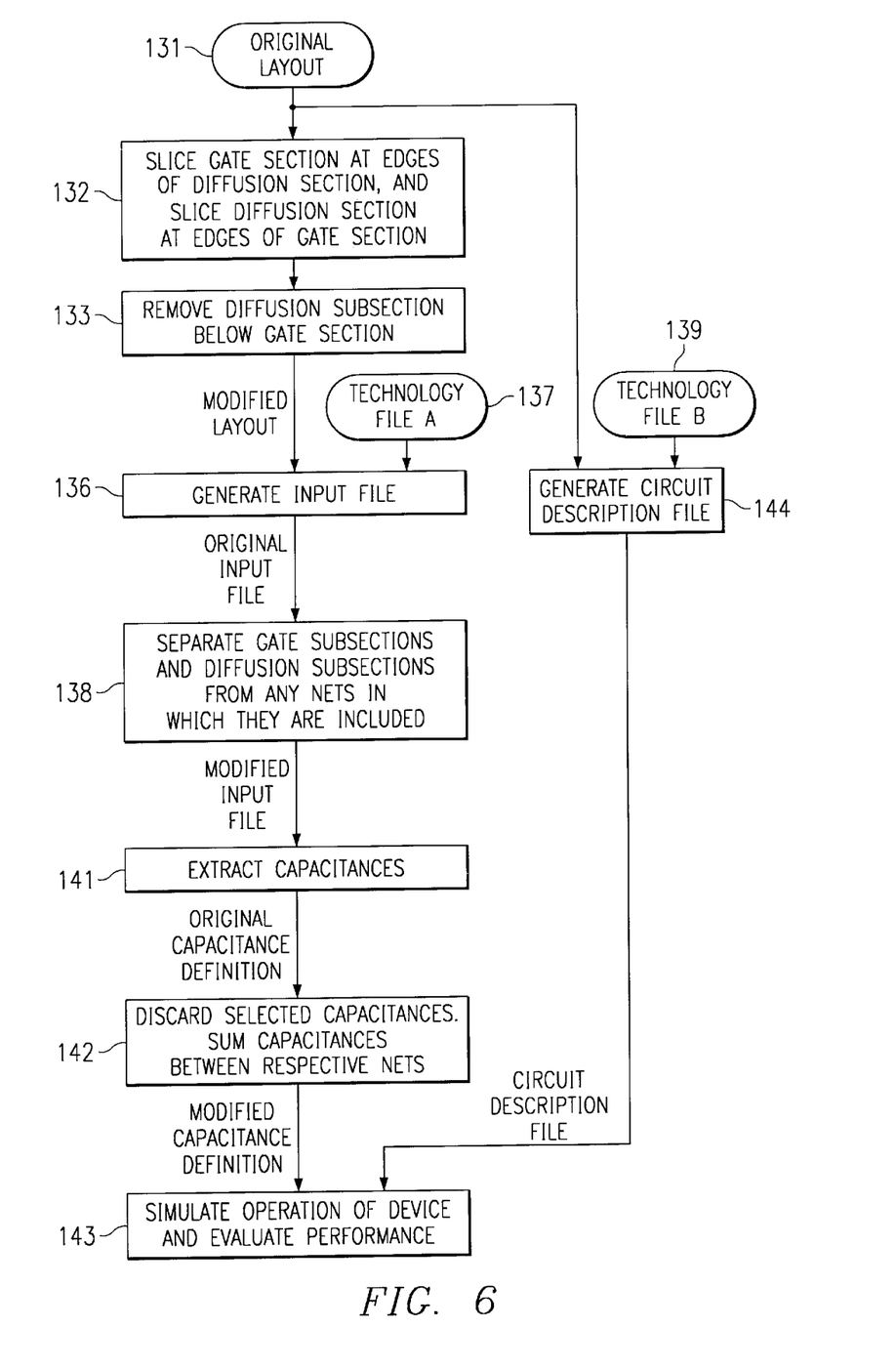
FIG. 6 is a flowchart showing a sequence of steps which embodies the present invention and which facilitates simulation of an integrated circuit such as that shown in FIG. 1.

More specifically, the procedure begins at block 131 in FIG. 6, which involves preparation for the transistor of FIG. 1 of the original layout 50 depicted in FIGS. 2 and 3. Next, at block 132, two theoretical slices are made in the gate section 57, at locations corresponding to edges of the diffusion section. In effect, these are the slices which are shown at 71 and 72 in FIG. 2, and which have already been discussed above. Similarly, two theoretical slices are made in the diffusion section at locations corresponding to the edges of the gate section. These are the slices which are shown at 76 and 77 in FIG. 3, and which have already been described above.

From block 132, control proceeds to block 133, where the portion of the diffusion section located below the gate section is removed from consideration. Stated differently, the portion of the diffusion section between slices 76 and 77 is removed, as already discussed above in association with FIG. 3. Blocks 132 and 133 effectively convert the original layout 50 of FIGS. 2–3 into a modified layout, which is the modified-layout shown at 90 in FIGS. 4 and 5. The modified layout 90 has already been discussed above.

Next, with reference to FIG. 6, the modified layout 90 (FIGS. 4–5) and a technology file 137 are each supplied to block 136. The technology file 137 includes information defining characteristics of the particular semiconductor technology in which the transistor of FIG. 1 is implemented. For example, in the disclosed embodiment, this information indicates that the integrated circuit 10 is a CMOS device, identifies the thickness of metalization components such as the interconnects 36 and 37 in FIG. 1, identifies the dielectric constants associated with the material used for isolation layers, and so forth.

FIG. 6 also depicts a further technology file 139, the use of which will be discussed later. The technology file 139 includes most or all of the information which is in the technology file 137, but in a different format. The technology file 139 may also include some additional information which is not in the technology file 137, but for purposes of explaining the present invention there is no need to discuss the specific differences between the files 137 and 139. The technology files 137 and 139 are each a type of file which is known in the art, and further detailed discussion of them is therefore not provided here.

In the disclosed embodiment, block 136 involves execution of a capacitance extractor input file generator computer program. In this regard, the disclosed embodiment uses an existing program which is commercially available under the tradename TMA LAYOUT from Avant! Corporation of Fremont, Calif. However, some other equivalent existing program could alternatively be used. The input file generator program takes the modified layout shown in FIGS. 4 and 5, and prepares from it a capacitance extractor input file, which is referred to as an original input file.

The original input file includes a series of statements which represent a definition of the geometry and location of each of the conductive and dielectric sections and subsections that are embodied in the modified layout from block 133, including the transistor. The statements may also include information such as the dielectric constants for the various dielectric sections and subsections.

In addition to a definition of the transistor, the original input file generated at block 136 includes a definition of which of the conductive sections and subsections are coupled to each other. Stated differently, the original input file includes a definition of various conductive paths within the integrated circuit, which are commonly referred to as nets, and which each include one or more of the sections and subsections of the modified layout 90.

For example, with reference to FIGS. 4 and 5, the diffusion subsection 56A, the contact section 61 and the metalization section 63 are in electrical contact with each other. Consequently, the original input file generated at block 136 would include a statement indicating that these three elements are electrically coupled or merged, and thus collectively define a conductive path or net. Similarly, the original input file would include a statement indicating that the diffusion subsection 56B, contact section 62 and metalization section 64 are electrically coupled or merged, and thus collectively define a further conductive path or net. Still another statement in the original input file would indicate that the three gate subsections 57A, 57B and 57C are all electrically coupled or merged, and thus collectively define yet another conductive path or net. A further statement in the input file would identify the conductive ground plane section 52 as yet another conductive path or net.

The original input file generated at block 36 is supplied to block 138, where a modified version of the input file is prepared in order to facilitate an accurate determination of each of the various interconnect capacitances 111–118 shown in FIG. 4. In this regard, and as discussed above, the original input file from block 136 includes a statement indicating that the gate subsections 57A, 57B and 57C are electrically coupled to each other. However, as evident from the foregoing discussion, the present invention recognizes that these gate subsections must be treated as if they were electrically separate from each other, in order to accurately determine the interconnect capacitances such as those identified at 111–118 in FIG. 4. Accordingly, with respect to the statement in the original input file which indicates that the three gate subsections 57A–57C are electrically coupled, a modification is made to this statement so that these three gate subsections will be treated as if they were electrically separate. Stated differently, the net which includes the three gate subsections 57A–57C is effectively subdivided into three net portions, which each correspond to a respective one of the gate subsections 57A–57C. Each of these net portions will be treated as an independent net, which is electrically separate from all other nets.

Although the gate subsections 57A and 57C are treated as separate net portions for purposes of the present discussion, it would alternatively be possible to treat these two subsections as being part of a single net portion which is electrically separate from the net portion that includes gate subsection 57B.

Modifications are also made to the statement in the original input file which defines the conductive net that includes the diffusion subsection 56A, the contact section 61 and the metalization section 63. These modifications effectively subdivide this net into three net portions that respectively include the diffusion subsection 56A, contact section 61 and metalization section 63. These three net portions are then treated as independent nets which are electrically separate from each other. In a similar manner, modifications are made to the statement in the original input file which defines the conductive net that includes diffusion subsection 56B, contact section 62 and metalization section 64. These modifications effectively subdivide this net into three net portions that respectively include the diffusion subsection 56B, contact section 62 and metalization section 64. These three net portions are then treated as independent nets which are electrically separate from each other.

Although the present discussion explains that contact section 61 and metalization section 63 are treated as different net portions that are electrically separate, it would alternatively be possible to treat these sections 61 and 63 as being parts of a single net portion which are in electrical contact with each other, but which are electrically separate from a net portion that includes the diffusion subsection 56A. Similarly, the present discussion treats contact section 62 and metalization section 64 as respective net portions that are electrically separate, but they could alternatively be treated as parts of a single net portion which is electrically separate from a net portion that includes diffusion subsection 56B.

The modified input file which is created at block 138 is then supplied to block 141. Block 141 is implemented by executing a layout parasitic extractor (LPE) computer program, which in the disclosed embodiment is a three-dimensional capacitance extractor program. More specifically, the disclosed embodiment uses an existing extractor, program, which is commercially available under the tradename RAPHAEL from Avant! Corporation. Alternatively, the extractor program could be a different existing program which is commercially available under the tradename QUICKCAP from Avant! Corporation, or an existing program which is commercially available under the tradename CELL_AN from OEA International, Inc. of Santa Clara, Calif.

In block 141, the extractor program will identify all of the interconnect capacitances which are shown at 111–118 in FIG. 4, as well as each of the device capacitances 101–106 which are shown in FIG. 5. As discussed above, the modified input file which is supplied to block 141 contains an indication that the gate subsections 57A–57C, the diffusion subsections 56A–56B, the contact sections 61–62 and the metalization sections 63–64 are each to be treated as a respective net portion which is electrically separate from all other net portions. In effect, each of these net portions is treated as an electrically separate and independent net. Due to the fact that these various net portions are each effectively treated as a separate and independent net, the known extractor program used in block 141 will accurately identify all of the interconnect capacitances 111–118. This would not be the case if the extractor program was supplied with the original input file from block 136 rather than the modified input file from block 138. All of the capacitances identified by the extractor program in block 141 are incorporated into an original capacitance definition, which is supplied from block 141 to block 142.

At block 142, the original capacitance definition from block 141 is modified. More specifically, the original capacitance definition generated at block 141 includes not only the interconnect capacitances 111–118, but also all of the device capacitances 101–106. However, as explained previously, existing computer models for devices such as the transistor of FIGS. 1–5 already include a definition of each of the device capacitances 101–106. Accordingly, in order to avoid taking the device capacitances 101–106 into account twice, the portions of the original capacitance definition which represent the device capacitances 101–106 are discarded. This is facilitated by the fact that, according to a feature of the present invention, the device capacitances and the interconnect capacitances are separate and distinct in the capacitance definition generated in block 141.

Then, also in block 142, the various net portions created at step 138 by subdividing nets are effectively recombined into their original nets. For example, with reference to FIG. 4, gate subsections 57A, 57B and 57C were treated as separate net portions, but at block 142 are again treated as a single net. Similarly, the diffusion subsection 56A, contact section 61 and metalization section 63 are all again treated as a single net. Further, diffusion subsection 56B, contact section 62 and metalization section 64 are all treated as a single net.

Next, still in block 142, capacitances between net portions that are part of the same net are discarded. For example, capacitances in the capacitance definition which are between the gate subsection 57A and the gate subsection 57B are discarded, because these subsections are again being treated as parts of the same net.

Then, for each possible pair of the nets, all of the various capacitances between the two nets of the pair are summed, which may alternatively be referred to as merging the capacitances. As an example, interconnect capacitances 111, 113, 115 and 117 have all been measured between one net which includes gate subsections 57A–57C and a further net which includes diffusion subsection 56A, contact section 61 and metalization section 63. Accordingly, interconnect capacitances 111, 113, 115 and 117 are summed to obtain a single capacitance value representing the total interconnect capacitance between these two nets. Similarly, interconnect capacitances 112, 114, 116 and 118 are all between the net which includes gate subsections 57A–57C, and the net which includes diffusion subsection 56B, contact section 62 and metalization section 64. Accordingly, interconnect capacitances 112, 114, 116 and 118 are summed.

Block 142 then supplies to block 143 a modified capacitance definition, which includes values that each represent the total interconnect capacitance between a respective pair of the nets. For example, in the disclosed embodiment, the modified capacitance definition will include a first capacitance value corresponding to the sum of interconnect capacitances 111, 113, 115 and 117, and a second capacitance value corresponding to the sum of interconnect capacitances 112, 114, 116 and 118.

When capacitance values are determined according to the techniques of the present invention, the capacitance values are, on average, within about 5% of the actual values of the corresponding physical capacitances that would exist in the actual integrated circuit. More specifically, the capacitance values have an average error which is only about 5% if the input definition describes dimensions of the native drawn layout, but this average error can be reduced to about 1% if the input definition describes the actual silicon dimensions. This is a significant improvement over pre-existing techniques of the type discussed earlier. As previously discussed, the most accurate of the pre-existing techniques will, at best, provide an average error level of at least 16%.

In FIG. 6, the original layout from block 131 is supplied not only to block 132, as discussed above, but also to a block 144, which also receives the second technology file 139 that was discussed above. In the disclosed embodiment, block 144 involves execution of a circuit description generator computer program. More specifically, the disclosed embodiment uses an existing program which is commercially available under the tradename CADENCE DESIGN TOOLS from Cadence Design Systems, Inc. of San Jose, Calif. However, some other equivalent existing program could alternatively be used.

The circuit description file generated in block 144 includes a series of statements which represent a definition of the circuitry within the integrated circuit 10, including the transistor. The circuit description file will ultimately be supplied to a separate simulator computer program, which in the disclosed embodiment is an existing program that is used in the block 143 and discussed later. The simulator program can simulate operation of the integrated circuit of FIG. 1, in order to permit evaluation of its performance, including factors such as switching speed and power consumption.

In preparing the circuit description file, the circuit description generator program responds to the definition of the transistor in the original layout 50 by using a pre-existing transistor model to represent the transistor. This transistor model takes into account all of the internal device capacitances 101–106 which are illustrated in FIG. 5. However, since the model is intended to represent the transistor itself, and not interconnections to the transistor, the transistor model does not take into account any of the interconnect capacitances 111–118 which are shown in FIG. 4, because they represent capacitances between structure internal to the transistor and structure external to the transistor. Accordingly, the interconnect capacitances 111–118 have to be taken into account separately, namely through use of techniques which include those discussed above in association with blocks 132–133, 136–138, and 141–142.

In addition to a definition of the transistor, the circuit description file generated at block 144 includes a definition of other structure within the integrated circuit 10. Further, the circuit description file includes a definition of various conductive paths within the integrated circuit, which as discussed above are referred to as nets.

As discussed above, block 143 receives the modified capacitance definition from block 142, which includes a definition of the interconnect capacitances 111–118. Block 143 also receives the circuit description file generated in block 144, and which includes a definition of the internal structure of the transistor device, including the device capacitances 101–106. In the disclosed embodiment, block 143 is implemented by executing the simulator computer program that was mentioned above. More specifically, the disclosed embodiment uses an existing simulator program which is commercially available under the tradename SPICE from Avant! Corporation. However, some other equivalent existing simulator program could alternatively be used.

Since the simulator program receives an accurate definition of the device capacitances 101–106 from the circuit description file created at block 144, and also receives an accurate definition of the interconnect capacitances 111–118 from the modified capacitance definition created at block 142, the simulator program is able to provide a very accurate simulation of the operation of the integrated circuit 10, including the transistor in it. The simulator program is used to evaluate the expected operational performance of the integrated circuit and transistor, including factors such as switching speed, power consumption, and so forth.

If the evaluation of the integrated circuit 10 through simulation shows that the expected performance is not satisfactory, then the original design and/or the original layout (FIGS. 2–3) can be modified, and then the modified design and/or layout can be re-evaluated according to the procedure shown in FIG. 6, in order to optimize the overall design before the integrated circuit 10 of FIG. 1 is actually fabricated. This process can be iteratively repeated until acceptable performance characteristics are achieved. Since the techniques according to the present invention are several times more accurate than other known techniques, the number of iterations in this design cycle will typically be less than would be required with other known techniques, and there is a greatly enhanced probability that the first implementation in silicon will be acceptable.

Figure 7:
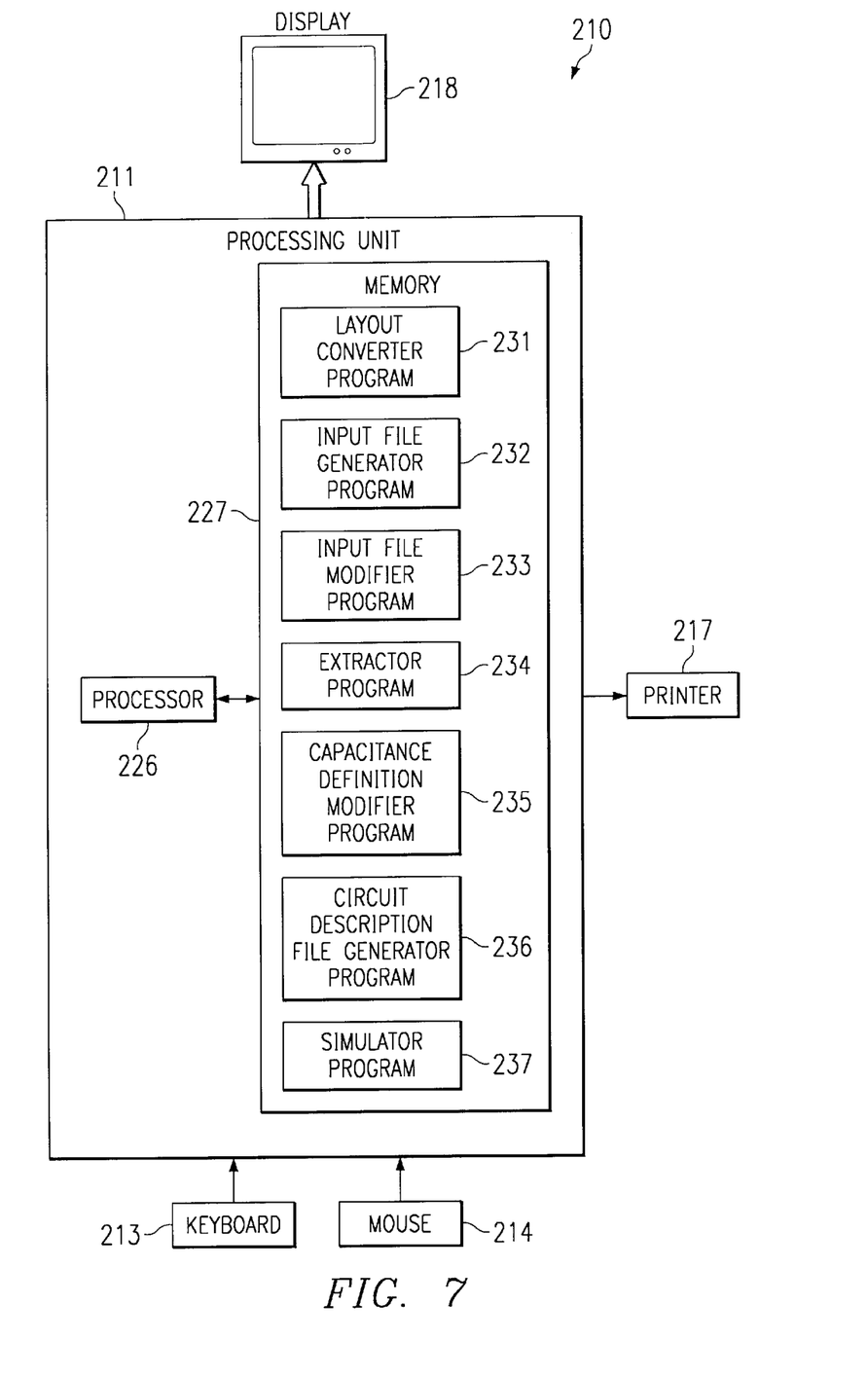
FIG. 7 is a diagrammatic view of a computer system which automatically carries out various steps in the sequence depicted in FIG. 6.

In the inventive method which has been explained above in association with FIG. 6, some or all of the steps could be performed manually. However, for speed, efficiency and convenience, the disclosed embodiment uses a computer to carry out virtually all of the data manipulation discussed in association with FIG. 6. More specifically, FIG. 7 is a diagrammatic view of a computer system 210, which is used to carry out most of the steps in the procedural sequence depicted in FIG. 6. In the disclosed embodiment, the hardware of the computer system 210 is a commercially available machine, for example a workstation of the type which is commonly known as a Sun Microsystem, and which is commercially available from Sun Microsystems, Inc. of Palo Alto, Calif. However, other types of existing computer systems could alternatively be used.

The computer system 210 includes a processing unit 211, a standard keyboard 213, a standard pointing device 214 such as a mouse, a standard printer 217, and a standard cathode ray tube (CRT) display 218. The processing unit 211 includes a processor 226, which is a microprocessor of a known type. The processing unit 211 further includes a memory 227, which is operatively coupled to the processor 226. In FIG. 7, the memory 227 is shown as a single diagrammatic block, but is intended to collectively represent several different types of memory that are actually present in the processing unit 211, including a hard disk drive, a read only memory (ROM), and a random access memory (RAM).

Several computer programs 231–237 are stored in the memory 227, and each of these programs can be executed by the processor 226. More specifically, the program 231 is a layout converter program, which can convert the original layout 50 of FIGS. 2–3 to the modified layout 90 of FIGS.

4–5, in the manner discussed above in association with blocks 132–133 of FIG. 6. The program 232 is the input file generator program discussed above in association with block 136 of FIG. 6. The program 233 is an input file modifier program, which can convert the original input file produced by the program 232 into a modified input file, as discussed above in association with block 138 of FIG. 6. The program 234 is the extractor program discussed above in association with block 141 of FIG. 6. The program 235 is a capacitance definition modifier program, which can convert the original capacitance definition generated by extractor program 234 into a modified capacitance definition, in the manner discussed above in association with block 142 of FIG. 6. The program 236 is the circuit description generator program discussed above in association with block 144 of FIG. 6. The program 237 is the simulator program discussed above in association with block 143 of FIG. 6.

Although the programs 231–237 are implemented in the disclosed embodiment as seven separate computer programs that are executed successively in order to carry out the sequence depicted in the flowchart of FIG. 6, it will be recognized that some or all of these programs could be combined, without departing from the spirit and scope of the present invention.

The present invention provides a number of technical advantages. One such technical advantage is that all significant capacitances associated with a device in an integrated circuit are taken into account by a simulator program, including both device capacitances between internal structural parts of the device, and interconnect capacitances between structure internal to the device and structure external to the device. A related advantage is that device and interconnect capacitance values determined according to the present invention are distinct from each other. Therefore, when used in association with a known technique which accurately models the device capacitances, but not the interconnect capacitances, an accurate definition of interconnect capacitances can be provided to supplement the model. The capacitance definition includes an accurate definition of the interconnect capacitances, but ignores the device capacitances, which are already inherent in the model.

A further technical advantage is that the present invention provides a significantly more accurate identification of the values of all capacitances associated with a circuit device in an integrated circuit. In this regard, the present invention provides a level of accuracy which is at least three times better than, and in some cases more than an order of magnitude better than, other known techniques. The significantly higher level of accuracy provided by the invention facilitates the design of current and future generations of integrated circuits, especially integrated circuits such as static random access memory cells (SRAM cells), which have complex physical structures. The increased accuracy of the invention permits a new integrated circuit design to be evaluated, adjusted and finalized more rapidly, thereby reducing the time and cost involved in product development cycles for new integrated circuits.

Still another advantage of the present invention is that it uses an approach which is less complicated than some other known techniques, and thus easier to understand. This is due in part to the fact that there is a one-to-one correspondence between actual physical capacitances in an integrated circuit and the theoretical capacitance values determined according to the invention.

Although one embodiment has been illustrated and described in detail, it will be understood that various substitutions and alterations can be made therein without departing from the present invention. For example, and as discussed above, the disclosed embodiment uses several separate computer programs that are executed in succession, but it will be recognized that it would be possible to integrate some or all of these separate programs into a single program. Further, the disclosed embodiment involves the specific context of a field effect transistor, but it will be recognized that the techniques according to the present invention can also be adapted for use with other types of transistors, and other types of circuit devices. In addition, with respect to the example of a field effect transistor, the disclosed embodiment uses a particular example of a layout which represents the transistor, but it will be recognized that there are other layouts for a transistor to which the basic principles of the invention are equally applicable. Other changes are also possible without departing from the spirit and scope of the present invention, as defined by the following claims.

What is claimed is:

1. A method of simulating an integrated circuit which includes a plurality of conductive nets that are electrically separate from each other, which includes a device having a plurality of conductive first sections that are each part of a respective said net, and which includes a conductive second section external to said device, said second section being part of one of said nets which includes one of said first sections, said method comprising the step of determining a set of capacitances associated with said device by:

subdividing at least one of said nets on a theoretical basis to identify a plurality of net portions that collectively define said at least one of said nets so that said first and second sections are allocated to different said net portions;

treating said net portions as theoretically electrically separate from each other, while identifying respective capacitances between each said net portion and each of the other net portions;

discarding selected ones of said capacitances; and determining each of the remaining ones of said capacitances of said set by summing the capacitances which have been identified between each of said net portions of one of said nets and a net portion of a further said net.

2. A method according to claim 1, wherein said summing step includes the step of summing the capacitances which have been identified between each of said net portions of said one of said nets and each of said net portions of said further net.

3. A method according to claim 1, wherein said device is a field effect transistor, and including the step of using a representation of said transistor that includes four of said first sections which respectively represent a substrate ground plane section, a first diffusion section, a second diffusion section, and a gate section.

4. A method according to claim 3, wherein said gate section has end portions that project outwardly beyond each of said diffusion sections, and wherein said subdividing step includes the step of subdividing said gate section into three of said subsections which respectively correspond to said two end sections and a central portion therebetween.

5. A method according to claim 3, wherein said second section of said integrated circuit includes a conductive contact which is electrically coupled to one of said first and second diffusion sections, and wherein said subdividing step includes the step of allocating said contact and said one of said diffusion sections to different said net portions.

6. A method according to claim 1, including after said step of determining said set of capacitances, the step of evaluating expected operational characteristics of said device while simulating operation of said integrated circuit as a function of said set of capacitances.

7. A method of simulating an integrated circuit which includes a plurality of conductive nets that are electrically separate from each other, which includes a device having a plurality of conductive first sections that are each part of a respective said net, and which includes a conductive second section external to said device, said second section being part of one of said nets which includes one of said first sections, said method comprising the step of determining a set of capacitances associated with said device by:

subdividing at least one of said nets on a theoretical basis so as to identify a plurality of net portions that collectively define said nets, in a manner so that said first and second sections are allocated to different said net portions;

treating said net portions as theoretically electrically separate from each other, while identifying respective capacitances between each said net portion and each of the other net portions; and determining each said capacitance of said set by summing the capacitances which have been identified between each of said net portions of one of said nets and a net portion of a further said net;

wherein said step of determining each of said capacitances of said set includes the step of ignoring capacitances identified between predetermined pairs of said net portions.

8. A method according to claim 7, wherein said predetermined pairs include pairs in which the two net portions of the pair each include a respective said first section of said device.

9. A method according to claim 7, wherein said predetermined pairs include pairs in which each of the two net portions of the pair are respective parts of the same net.

10. A method of simulating an integrated circuit which includes a plurality of conductive nets that are electrically separate from each other, which includes a device having a plurality of conductive first sections that are each part of a respective said net, and which includes a conductive second section external to said device, said second section being part of one of said nets which includes one of said first sections, said method comprising the step of determining a set of capacitances associated with said device by:

subdividing at least one of said nets on a theoretical basis so as to identify a plurality of net portions that collectively define said nets, in a manner so that said first and second sections are allocated to different said net portions;

treating said net portions as theoretically electrically separate from each other, while identifying respective capacitances between each said net portion and each of the other net portions; and determining each said capacitance of said set by summing the capacitances which have been identified between each of said net portions of one of said nets and a net portion of a further said net;

wherein said device is a field effect transistor, and including the steps of:

preparing a layout containing a theoretical representation of said transistor which includes a diffusion section and a gate section, said gate section extending over a central portion of said diffusion section;

subdividing said diffusion section on a theoretical basis into three subsections, including a central subsection disposed below said gate section and outer subsections disposed on opposite sides of said central subsection;

discarding said central subsection; and treating each of said outer subsections and said gate section as respective said first sections of said device.

11. A computer program stored in a storage medium and intended for use in facilitating simulation of an integrated circuit which includes a plurality of conductive nets that are electrically separate from each other, which includes a device having a plurality of conductive first sections that are each part of a respective said net, and which includes a conductive second section external to said device, said second section being part of one of said nets which includes one of said first sections, said computer program being operative when executed to determine a set of capacitances associated with said device by:

subdividing at least one of said nets on a theoretical basis so as to identify a plurality of net portions that collectively define said nets, in a manner so that said first and second sections are allocated to different said net portions;

treating said net portions as theoretically electrically separate from each other, while identifying respective capacitances between each said net portion and each of the other net portions;

discarding selected ones of said capacitances; and determining each of the remaining ones of said capacitance by summing the capacitances which have been identified between each of said net portions of one of said nets and a net portion of a further said net.

12. A computer program according to claim 11, said computer program being further operative when executed to carry out said summing step by summing the capacitances which have been identified between each of said net portions of said one of said nets and each of said net portions of said further net.

13. A computer program according to claim 11, wherein said device is a field effect transistor, and wherein said computer program is further operative when executed to:

use a representation of said transistor which includes four of said first sections that respectively represent a substrate ground plane section, a first diffusion section, a second diffusion section, and a gate section; and carry out said subdividing step by subdividing said gate section into three of said subsections which respectively correspond to a central portion of said gate section and to end portions of said gate section; said end portions being disposed on opposite sides of said central portion and projecting outwardly beyond each of said diffusion sections.

14. A computer program stored in a storage medium and intended for use in facilitating simulation of an integrated circuit which includes a plurality of conductive nets that are electrically separate from each other, which includes a device having a plurality of conductive first sections that are each part of a respective said net, and which includes a conductive second section external to said device, said second section being part of one of said nets which includes one of said first sections, said computer program being operative when executed to determine a set of capacitances associated with said device by:

subdividing at least one of said nets on a theoretical basis so as to identify a plurality of net portions that collectively define said nets, in a manner so that said first and second sections are allocated to different said net portions;

treating said net portions as theoretically electrically separate from each other, while identifying respective capacitances between each said net portion and each of the other net portions; and determining each said capacitance of said set by summing the capacitances which have been identified between each of said net portions of one of said nets and a net portion of a further said net;

wherein said computer program is further operative when executed to carry out said step of determining each said capacitance of said set by ignoring capacitances identified between predetermined pairs of said net portions, including pairs in which the two net portions of the pair each include a respective said first section of said device.

15. A computer program stored in a storage medium and intended for use in facilitating simulation of an integrated circuit which includes a plurality of conductive nets that are electrically separate from each other, which includes a device having a plurality of conductive first sections that are each part of a respective said net, and which includes a conductive second section external to said device, said second section being part of one of said nets which includes one of said first sections, said computer program being operative when executed to determine a set of capacitances associated with said device by:

subdividing at least one of said nets on a theoretical basis so as to identify a plurality of net portions that collectively define said nets, in a manner so that said first and second sections are allocated to different said net portions;

treating said net portions as theoretically electrically separate from each other, while identifying respective capacitances between each said net portion and each of the other net portions; and determining each said capacitance of said set by summing the capacitances which have been identified between each of said net portions of one of said nets and a net portion of a further said net;

wherein said computer program is further operative when executed to carry out said step of determining each said capacitance of said set by ignoring capacitances identified between predetermined pairs of said net portions, including pairs in which each of the two net portions of the pair are respective parts of the same net.

16. A computer program stored in a storage medium and intended for use in facilitating simulation of an integrated circuit which includes a plurality of conductive nets that are electrically separate from each other, which includes a device having a plurality of conductive first sections that are each part of a respective said net, and which includes a conductive second section external to said device, said second section being part of one of said nets which includes one of said first sections, said computer program being operative when executed to determine a set of capacitances associated with said device by:

subdividing at least one of said nets on a theoretical basis so as to identify a plurality of net portions that collectively define said nets, in a manner so that said first and second sections are allocated to different said net portions;

treating said net portions as theoretically electrically separate from each other, while identifying respective capacitances between each said net portion and each of the other net portions; and determining each said capacitance of said set by summing the capacitances which have been identified between each of said net portions of one of said nets and a net portion of a further said net;

wherein said device is a field effect transistor, and wherein said computer program is further operative when executed to:

receive a layout containing a theoretical representation of said transistor which includes a diffusion section and a gate section, said gate section extending over a central portion of said diffusion section;

subdivide said diffusion section on a theoretical basis into three subsections, including a central subsection disposed below said gate section and outer subsections disposed on opposite sides of said central subsection;

discard said central subsection; and treat each of said outer subsections and said gate section as respective said first sections of said device.

17. An apparatus for simulating an integrated circuit which includes a plurality of conductive nets that are electrically separate from each other, which includes a device having a plurality of conductive first sections that are each part of a respective said net, and which includes a conductive second section external to said device, said second section being part of one of said nets which includes one of said first sections, said apparatus comprising a computer system which includes a processor and a memory that stores computer program code executable by said processor, wherein in response to execution of said computer program code said processor is operative to determine a set of capacitances associated with said device by:

subdividing at least one of said nets on a theoretical basis so as to identify a plurality of net portions that collectively define said nets, in a manner so that said first and second sections are allocated to different said net portions;

treating said net portions as theoretically electrically separate from each other, while identifying respective capacitances between each said net portion and each of the other net portions;

discarding selected ones of said capacitances; and determining each of the remaining said capacitance of said set by summing the capacitances which have been identified between each of said net portions of one of said nets and a net portion of a further said net.

18. An apparatus according to claim 17, wherein said processor is further operative in response to execution of said computer program code to carry out said summing step by summing the capacitances which have been identified between each of said net portions of said one of said nets and each of said net portions of said further net.

19. An apparatus for simulating an integrated circuit which includes a plurality of conductive nets that are electrically separate from each other, which includes a device having a plurality of conductive first sections that are each part of a respective said net, and which includes a conductive second section external to said device, said second section being part of one of said nets which includes one of said first sections, said apparatus comprising a computer system which includes a processor and a memory that stores computer program code executable by said processor, wherein in response to execution of said computer program code said processor is operative to determine a set of capacitances associated with said device by:

subdividing at least one of said nets on a theoretical basis so as to identify a plurality of net portions that collectively define said nets, in a manner so that said first and second sections are allocated to different said net portions;

treating said net portions as theoretically electrically separate from each other, while identifying respective capacitances between each said net portion and each of the other net portions; and determining each said capacitance of said set by summing the capacitances which have been identified between each of said net portions of one of said nets and a net portion of a further said net;

wherein said processor is further operative in response to execution of said computer program code to carry out said step of determining each said capacitance of said set by ignoring capacitances identified between predetermined pairs of said net portions, including pairs in which the two net portions of the pair each include a respective said first section of said device.

20. An apparatus for simulating an integrated circuit which includes a plurality of conductive nets that are electrically separate from each other, which includes a device having a plurality of conductive first sections that are each part of a respective said net, and which includes a conductive second section external to said device, said second section being part of one of said nets which includes one of said first sections, said apparatus comprising a computer system which includes a processor and a memory that stores computer program code executable by said processor, wherein in response to execution of said computer program code said processor is operative to determine a set of capacitances associated with said device by:

subdividing at least one of said nets on a theoretical basis so as to identify a plurality of net portions that collectively define said nets, in a manner so that said first and second sections are allocated to different said net portions;

treating said net portions as theoretically electrically separate from each other, while identifying respective capacitances between each said net portion and each of the other net portions; and determining each said capacitance of said set by summing the capacitances which have been identified between each of said net portions of one of said nets and a net portion of a further said net;

wherein said processor is further operative in response to execution of said computer program code to carry out said step of determining each said capacitance of said set by ignoring capacitances identified between predetermined pairs of said net portions, including pairs in which each of the two net portions of the pair are respective parts of the same net.

21. A method of simulating a portion of an integrated circuit which comprises the steps of:

defining a transistor having a substrate with a ground plane and a diffusion region thereover having source/drain regions and a channel region therebetween, a gate region over the channel region, contact sections over the source/drain regions and metallization sections over the contact sections;

then defining and determining device capacitances and interconnect capacitances; and discarding the device capacitances.

22. The method of claim 21 further including the step of combining the interconnect capacitances with separately determined device capacitances to simulate operation of the device and evaluate the performance thereof.

23. The method of claim 22 wherein said device capacitances include the capacitance between the source/drain regions and the ground plane, the capacitance between the gate region and the ground plane, the capacitance between the gate and the source/drain regions and the capacitance between the source/drain regions.

24. The method of claim 21 wherein said device capacitances include the capacitance between the source/drain regions and the ground plane, the capacitance between the gate region and the ground plane, the capacitance between the gate and the source/drain regions and the capacitance between the source/drain regions.

* * * * *